(12) United States Patent
Saito et al.

(10) Patent No.: US 10,290,731 B2
(45) Date of Patent: May 14, 2019

(54) SEMICONDUCTOR DEVICE, POWER SUPPLY CIRCUIT, AND COMPUTER

(71) Applicant: Kabushiki Kaisha Toshiba, Minato-ku (JP)

(72) Inventors: Hisashi Saito, Yokohama (JP); Tatsuo Shimizu, Shinagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/446,518

(22) Filed: Mar. 1, 2017

(65) Prior Publication Data

US 2018/0061974 A1   Mar. 1, 2018

(30) Foreign Application Priority Data

Aug. 29, 2016 (JP) .................. 2016-166639

(51) Int. Cl.

| H01L 29/04 | (2006.01) |
|---|---|
| H01L 29/10 | (2006.01) |
| H01L 29/20 | (2006.01) |
| H01L 29/49 | (2006.01) |
| H01L 29/66 | (2006.01) |

(Continued)

(52) U.S. Cl.
CPC .......... *H01L 29/7787* (2013.01); *H01L 29/04* (2013.01); *H01L 29/2003* (2013.01); *H01L 29/205* (2013.01); *H01L 29/207* (2013.01); *H01L 29/4966* (2013.01); *H01L 29/66462* (2013.01); *H01L 29/7786* (2013.01); *H01L 29/1066* (2013.01)

(58) Field of Classification Search
CPC ............ H01L 29/2003; H01L 29/7787; H01L 29/04–29/045
See application file for complete search history.

(56) References Cited

U.S. PATENT DOCUMENTS

| 7,629,632 B2 | 12/2009 | Twynam | |
|---|---|---|---|
| 2003/0027394 A1* | 2/2003 | Toyama | ............ H01L 21/28593 438/289 |

(Continued)

FOREIGN PATENT DOCUMENTS

| JP | 2007-201279 | 8/2007 |
|---|---|---|
| JP | 2008-124374 | 5/2008 |

(Continued)

OTHER PUBLICATIONS

H. Asahi, et al. "Very strong photoluminescence emission from GaN grown on amorphous silica substrate by gas source MBE", Journal of Crystal Growth, 201/202, 1999, p. 371-375.

*Primary Examiner* — Amar Movva
(74) *Attorney, Agent, or Firm* — Oblon, McClelland, Maier & Neustadt, L.L.P.

(57) ABSTRACT

A semiconductor device of an embodiment includes a nitride semiconductor layer, a first electrode provided on the nitride semiconductor layer, a second electrode provided on the nitride semiconductor layer, a third electrode provided above the nitride semiconductor layer, the third electrode provided between the first electrode and the second electrode, the third electrode containing a polycrystalline nitride semiconductor containing a p-type impurity, and a first insulating layer provided between the nitride semiconductor layer and the third electrode.

15 Claims, 7 Drawing Sheets

(51) Int. Cl.
*H01L 29/205* (2006.01)
*H01L 29/207* (2006.01)
*H01L 29/778* (2006.01)

(56) References Cited

U.S. PATENT DOCUMENTS

2003/0234420 A1* 12/2003 Forbes ............... G11C 16/0416
                                                      257/315
2004/0217444 A1* 11/2004 Ooms ............... H01L 21/31691
                                                      257/532
2007/0176215 A1   8/2007 Yanagihara et al.
2010/0330754 A1* 12/2010 Hebert .............. H01L 29/66462
                                                      438/172
2011/0017998 A1   1/2011 Nakano et al.
2012/0319165 A1  12/2012 Nakayama

FOREIGN PATENT DOCUMENTS

| JP | 2011-100967 | 5/2011 |
| JP | 2011-129607 | 6/2011 |
| JP | 2014-27187  | 2/2014 |
| JP | 5749580     | 7/2015 |

\* cited by examiner

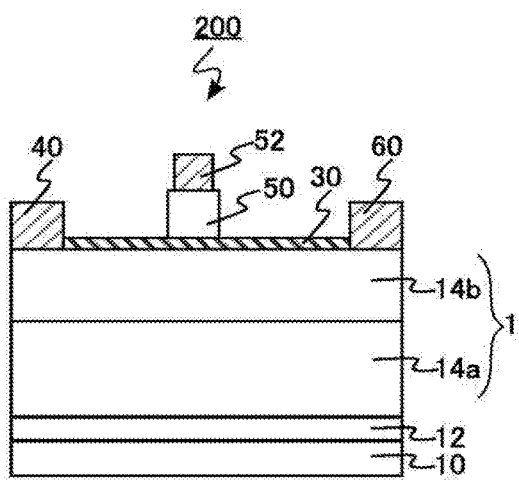 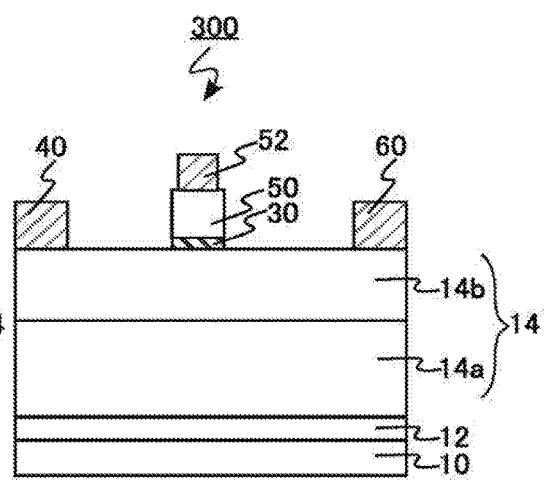

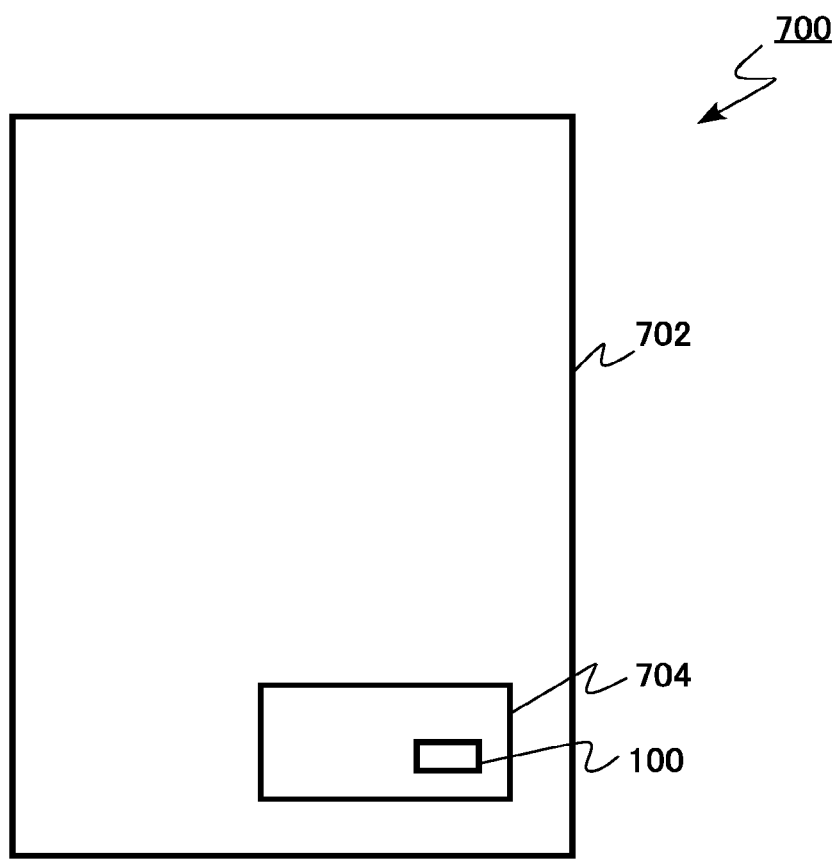

SEMICONDUCTOR DEVICE, POWER SUPPLY CIRCUIT, AND COMPUTER

CROSS-REFERENCE TO RELATED APPLICATION

This application is based upon and claims the benefit of priority from Japanese Patent Application No. 2016-166639, filed on Aug. 29, 2016, the entire contents of which are incorporated herein by reference.

FIELD

Embodiments described herein relate generally to a semiconductor device, a power supply circuit and a computer.

BACKGROUND

In a power device using silicon (Si), a low on-resistance around a limit of Si is realized. In order to further improve a breakdown voltage and to reduce an on-resistance, a material used for the power device is preferably changed.

By using a nitride semiconductor such as GaN or AlGaN, a trade-off relationship depending on a semiconductor material can be improved, and therefore a dramatically high breakdown voltage of the power device and reduction of a low on-resistance thereof can be achieved.

BRIEF DESCRIPTION OF THE DRAWINGS

FIG. 3A-B is a schematic cross-sectional view of a semiconductor device of a second embodiment;

FIG. 7 is a schematic view of a computer of a fourth embodiment.

DETAILED DESCRIPTION

Figure 1:
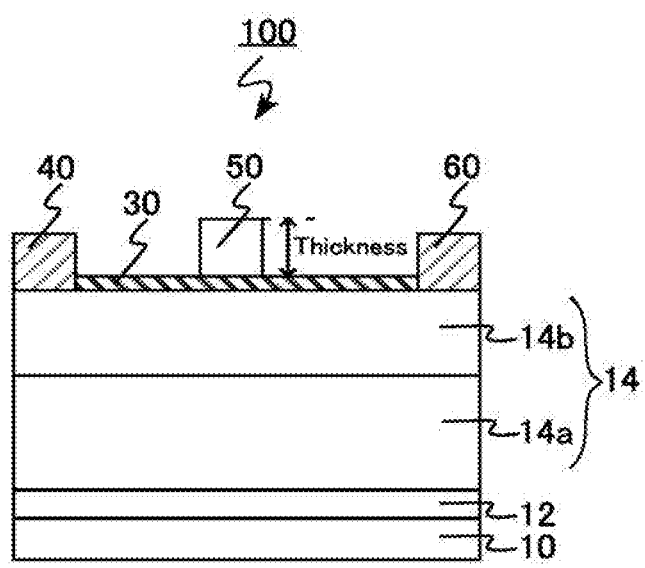
FIG. 1 is a schematic cross-sectional view of a semiconductor device of a first embodiment.

Hereinafter, an embodiment of the present disclosure will be described with reference to the drawings.

Here, the same reference sign is given to the same or similar components, and repeated description thereof may be omitted.

Here, a "nitride semiconductor" is a general term for a semiconductor including gallium nitride (GaN), aluminum nitride (AlN), indium nitride (InN), and an intermediate composition thereof.

Here, "undoped" means that an impurity concentration is $1\times10^{16}$ cm$^{-3}$ or less. A Fermi level means an energy level at which an existence probability of an electron becomes ½.

Here, an upper direction in the drawings is described by "upper", and a lower direction in the drawings is described by "lower" in order to indicate a positional relation between components or the like. Here, concepts of "upper" and "lower" do not necessarily indicate a relation to the gravity direction. Embodiments described below can be performed in a direction different from the direction illustrated or described below.

First Embodiment

A semiconductor device of the present embodiment includes a nitride semiconductor layer; a first electrode provided on the nitride semiconductor layer; a second electrode provided on the nitride semiconductor layer; a third electrode provided above the nitride semiconductor layer, the third electrode provided between the first electrode and the second electrode, the third electrode containing a polycrystalline nitride semiconductor containing a p-type impurity; and a first insulating layer provided between the nitride semiconductor layer and the third electrode.

FIG. 1 is a schematic cross-sectional view of a semiconductor device 100 of the present embodiment. The semiconductor device of the present embodiment is a high electron mobility transistor (HEMT) using a nitride semiconductor.

The semiconductor device 100 includes a substrate 10, a third semiconductor layer 12, a nitride semiconductor layer 14, a first insulating layer 30, a source electrode (first electrode) 40, a first gate electrode (third electrode) 50, and a drain electrode (second electrode) 60.

Preferable examples of the substrate 10 include a silicon (Si) substrate, a silicon carbide (SiC) substrate, and a sapphire (Al$_2$O$_3$) substrate.

The nitride semiconductor layer 14 is provided on the substrate 10. In other words, the substrate 10 is provided on a side of the nitride semiconductor layer 14 opposite to the first insulating layer 30.

The nitride semiconductor layer 14 preferably includes a first semiconductor layer 14a and a second semiconductor layer 14b provided on the first semiconductor layer 14a and having a larger bandgap than the first semiconductor layer 14a in order to become a transistor having a HEMT structure with a high mobility.

The first semiconductor layer 14a is formed, for example, of undoped Al$_X$Ga$_{1-X}$N (0≤X<1). More specifically, the first semiconductor layer 14a is formed, for example, of undoped GaN. The first semiconductor layer 14a has a thickness, for example, of 0.5 μm or more and 3 μm or less.

The second semiconductor layer 14b is, for example, undoped Al$_Y$Ga$_{1-Y}$N (0<Y≤1, X<Y). More specifically, the second semiconductor layer 14b is, for example, undoped Al$_{0.2}$Ga$_{0.8}$N. The second semiconductor layer 14b has a thickness, for example, of 15 nm or more and 50 nm or less.

A hetero-junction interface is formed between the first semiconductor layer 14a and the second semiconductor layer 14b. When the semiconductor device 100 is turned on, two-dimensional electron gas (2DEG) is formed at the hetero-junction interface to become a carrier.

The third semiconductor layer 12 is provided between the substrate 10 and the nitride semiconductor layer 14 (first semiconductor layer 14a). The third semiconductor layer 12 is a buffer layer, and relaxes lattice mismatch between the substrate 10 and the nitride semiconductor layer 14. For example, the third semiconductor layer 12 has a multilayer structure of aluminum gallium nitride (Al$_W$Ga$_{1-W}$N (1<W<1)).

The source electrode 40 is provided on the nitride semiconductor layer 14 (second semiconductor layer 14b). The drain electrode 60 is provided on the nitride semiconductor layer 14. Each of the source electrode 40 and the drain electrode 60 is, for example, a metal electrode having a structure in which titanium (Ti) and aluminum (Al) are stacked.

Each of the source electrode 40 and the drain electrode 60 is preferably ohmic-bonded to the nitride semiconductor layer 14. A distance between the source electrode 40 and the drain electrode 60 is, for example, 5 µm or more and 30 µm or less.

The first gate electrode 50 is provided above the nitride semiconductor layer 14 between the source electrode 40 and the drain electrode 60.

The first gate electrode 50 contains a polycrystalline nitride semiconductor containing a p-type impurity.

The p-type impurity in the first gate electrode 50 preferably has a concentration of $1\times10^{19}$ atoms/cm$^3$ or more, and more preferably of $1\times10^{20}$ atoms/cm$^3$ or more in order to increase a threshold voltage of the semiconductor device 100.

The p-type impurity used in the first gate electrode 50 is magnesium (Mg), beryllium (Be), carbon (C), or zinc (Zn).

The polycrystalline nitride semiconductor used in the first gate electrode 50 preferably has a composition represented by the following formula.

(Chemical formula 1)

$$In_xAl_yGa_{1-x-y}N \qquad (1)$$

wherein each of x and y satisfies $0 \leq x+y < 0.5$, $0 \leq x$, and $0 \leq y$.

A product of the concentration of the p-type impurity in the first gate electrode 50 and a thickness of the first gate electrode 50 is preferably larger than a concentration of two-dimensional electron gas. That is, (concentration of p-type impurity in first gate electrode 50)×(thickness of first gate electrode 50)>(concentration of two-dimensional electron gas) is preferably satisfied.

The concentration of two-dimensional electron gas in the semiconductor device 100 can be determined by Hall measurement.

The thickness of the first gate electrode 50 is preferably 100 nm or less.

A distance between the first insulating layer 30 and the first semiconductor layer 14a is preferably constant between the source electrode 40 and the drain electrode 60.

The first insulating layer 30 is provided between the nitride semiconductor layer 14 and the first gate electrode 50. In the present embodiment, the first insulating layer 30 is provided on the nitride semiconductor layer 14 between the source electrode 40 and the drain electrode 60. The first gate electrode 50 is provided on the first insulating layer 30.

The first insulating layer 30 is a gate insulating layer. For example, the first insulating layer 30 contains a silicon oxide such as silicon dioxide (SiO$_2$), an aluminum oxide such as aluminum oxide (Al$_2$O$_3$), a hafnium oxide such as hafnium oxide (HfO$_2$), a silicon nitride such as silicon nitride (Si$_3$N$_4$), an aluminum nitride such as aluminum nitride (AlN), and a lanthanum oxide such as lanthanum oxide (La$_2$O$_3$).

The first insulating layer 30 more preferably contains a nitride insulator. The nitride insulator is a silicon nitride such as silicon nitride (Si$_3$N$_4$) or an aluminum nitride such as aluminum nitride (AlN). A portion of the nitride insulator in contact with the nitride semiconductor layer 14 is preferably a single crystal. The portion formed of a single crystal preferably has a thickness of 10 nm or less. A polycrystalline or amorphous nitride insulator may be provided on the portion of a single crystal.

Being a single crystal can be evaluated, for example, by spectral ellipsometry, X-Ray diffraction (XRD), or observing a lattice image using a photograph of a cross section of the semiconductor device 100 with a transmission electron microscope (TEM).

Figure 2A:
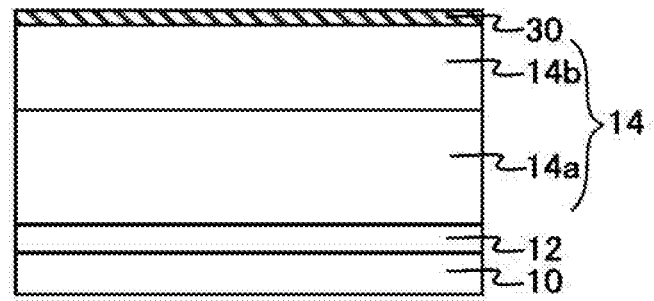
FIG. 2A-C is a schematic cross-sectional view illustrating a method for manufacturing the semiconductor device of the first embodiment.
Figure 2B:
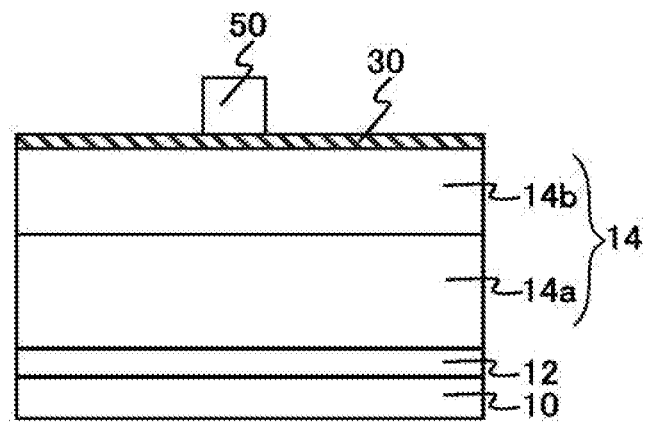
Figure 2C:
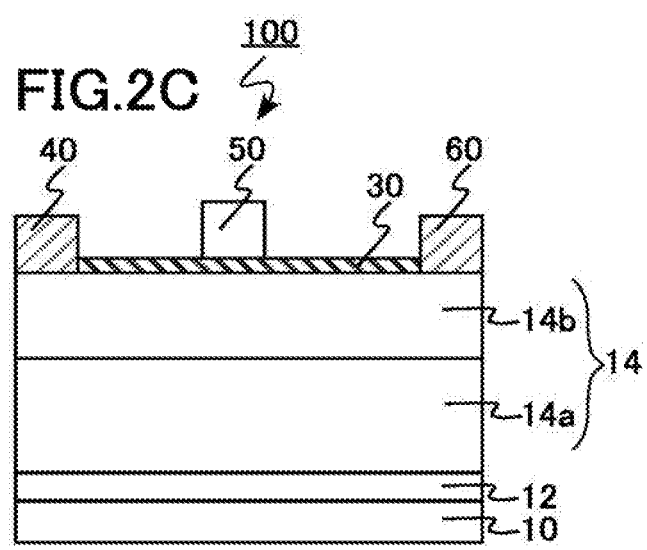

Next, a method for manufacturing the semiconductor device 100 of the present embodiment will be described. FIG. 2A-C is a schematic view of the semiconductor device during manufacturing in the method for manufacturing the semiconductor device of the present embodiment.

The method for manufacturing the semiconductor device 100 of the present embodiment includes forming the third semiconductor layer 12 on the substrate 10, forming the first semiconductor layer 14a on the third semiconductor layer 12, forming the second semiconductor layer 14b on the first semiconductor layer 14a, forming the first insulating layer 30 on the second semiconductor layer 14b, forming the first gate electrode 50 on the first insulating layer 30, forming the source electrode 40 on the second semiconductor layer 14b, and forming the drain electrode 60 on the second semiconductor layer 14b.

First, the third semiconductor layer 12 is formed on the substrate 10 by an epitaxial growth method.

Subsequently, the first semiconductor layer 14a is formed on the third semiconductor layer 12 by the epitaxial growth method. Subsequently, the second semiconductor layer 14b is formed on the first semiconductor layer 14a by the epitaxial growth method. In this way, the nitride semiconductor layer 14 is formed on the third semiconductor layer 12.

Subsequently, the first insulating layer 30 is formed on the second semiconductor layer 14b (FIG. 2A). Here, as a method for forming the first insulating layer 30, a sputtering method, a chemical vapor deposition (CVD) method, or an epitaxial growth method such as anatomic layer deposition (ALD) method, a metal organic chemical vapor deposition (MOCVD) method, or a molecular beam epitaxy (MBE) method can be used.

Subsequently, the first gate electrode 50 is formed on the first insulating layer 30 (FIG. 2B).

Subsequently, a part of the first insulating layer 30 is removed by photolithography and etching to expose a part of the second semiconductor layer 14b. Subsequently, the source electrode 40 and the drain electrode 60 are formed on the exposed part of the second semiconductor layer 14b such that the first gate electrode 50 is provided between the source electrode 40 and the drain electrode 60 (FIG. 2C) to obtain the semiconductor device 100 of the present embodiment.

Next, functions and effects of the semiconductor device 100 of the present embodiment will be described.

Like the semiconductor device 100 of the present embodiment, by including a gate electrode containing a polycrystalline nitride semiconductor containing a p-type impurity, this electrode becomes agate electrode having a large work function, and therefore a semiconductor device having a high threshold voltage can be provided.

Hereinafter, the functions and effects will be described in more detail.

For example, a metal material having a structure in which nickel (Ni) and gold (Au) are stacked is usually used for a gate electrode. In order to provide a normally-off semiconductor device having a high threshold voltage, it is necessary to use a gate electrode having a large work function and to increase a difference in a work function between the gate electrode and a semiconductor material used for the semiconductor device. However, in general, it is difficult to increase such a difference in a work function in a gate electrode using a metal material.

A wide bandgap semiconductor such as a nitride semiconductor is a semiconductor having a large work function. By doping a nitride semiconductor as a polycrystal with a p-type impurity, a Fermi level can be reduced while electric conductivity is obtained. Therefore, it is possible to obtain a material having a large work function and having electric conductivity, preferable for a gate electrode.

Here, when a gate insulating layer is formed by sputtering or CVD, the gate insulating layer becomes amorphous or polycrystalline. It is difficult to provide the first gate electrode 50 containing a single crystal nitride semiconductor on such a gate insulating layer.

However, when the nitride semiconductor is formed of a polycrystal, the nitride semiconductor can be easily provided on a gate insulating layer no matter whether the gate insulating layer is amorphous, a polycrystal, or a single crystal.

The work function of the nitride semiconductor doped with an n-type impurity is not largely different from that of a metal material. Therefore, the nitride semiconductor doped with an n-type impurity is not preferable as a gate electrode having a large work function.

The p-type impurity preferably has a concentration of $1 \times 10^{19}$ atoms/cm$^3$ or more, and more preferably of $1 \times 10^{20}$ atoms/cm$^3$ or more in order to reduce a Fermi level while electric conductivity is sufficiently obtained and to increase a threshold voltage of the semiconductor device 100.

Any one of magnesium, beryllium, carbon, and zinc can be used preferably as a p-type impurity of a nitride semiconductor.

The polycrystalline nitride semiconductor used in the first gate electrode 50 preferably has a composition represented by the following formula.

(Chemical formula 1)

$$In_xAl_yGa_{1-x-y}N \quad (1)$$

wherein each of x and y satisfies 0≤x+y<0.5, 0≤x, and 0≤y.

That is, a polycrystalline nitride semiconductor containing gallium in a larger amount than indium and aluminum is preferably used for the first gate electrode 50. A nitride semiconductor containing a large amount of gallium easily performs crystal growth and is easily formed into a p-type, and therefore easily obtains an electrode having high electric conductivity and a high threshold voltage.

In general, MOCVD is preferably used for forming the nitride semiconductor layer 14. When the first insulating layer 30 contains a nitride insulator, the nitride semiconductor layer 14 is formed, and the first insulating layer 30 and the first gate electrode 50 can be successively formed in the same device.

Aluminum nitride or silicon nitride is preferably used as the nitride insulator of the first insulating layer 30 from a viewpoint of improving reliability of a semiconductor device.

A portion in contact with the nitride semiconductor layer 14 in the first insulating layer 30 preferably contains a single crystal nitride insulator in order to reduce an interface state density between the first insulating layer 30 and the nitride semiconductor layer 14 and to provide a semiconductor device having high reliability.

A thickness capable of forming the single crystal nitride insulator is 10 nm at maximum. Therefore, the thickness of the single crystal nitride insulator is preferably 10 nm or less.

A distance between the first insulating layer 30 and the first semiconductor layer 14a is preferably constant between the source electrode 40 and the drain electrode 60. In other words, the nitride semiconductor layer 14 preferably has no trench structure or recess structure.

Examples of a means for obtaining a normally-off semiconductor device using a nitride semiconductor include a means for suppressing polarization of the nitride semiconductor. By providing a trench structure or a recess structure in a part of a nitride semiconductor layer, polarization can be suppressed.

However, when etching of a nitride semiconductor is performed in order to manufacture the trench structure or recess structure, the nitride semiconductor is largely damaged. Therefore, many impurity levels are formed in an interface with the first insulating layer 30 disadvantageously.

The semiconductor device 100 of the present embodiment intends to obtain a normally-off semiconductor device using the first gate electrode 50 containing a polycrystalline nitride semiconductor with a p-type impurity as described above. Therefore, it is possible to obtain the semiconductor device 100 having a constant distance between the first insulating layer 30 and the first semiconductor layer 14a, in which many impurity levels are not formed in an interface with the first insulating layer 30.

The thickness of the first gate electrode 50 is preferably 100 nm or less. This is because a too large thickness of the first gate electrode 50 makes a resistance of the first gate electrode 50 too high.

As described above, according to the semiconductor device of the present embodiment, a semiconductor device having a high threshold voltage can be provided.

Second Embodiment

A semiconductor device of the present embodiment is different from the semiconductor device of the first embodiment in further including a metal-containing second gate electrode (fourth electrode) 52 provided on a first gate electrode 50. Here, matters overlapping with the first embodiment will be omitted.

FIG. 3A-B is a schematic cross-sectional view of the semiconductor device of the present embodiment. FIG. 3A is a schematic cross-sectional view of a semiconductor device 200 of the present embodiment. FIG. 3B is a schematic cross-sectional view of a semiconductor device 300 of another aspect of the present embodiment.

A resistance of a polycrystalline nitride semiconductor with a p-type impurity used for the first gate electrode 50 is higher than that of a metal. Therefore, particularly when a semiconductor device is used for a switching of power or the like, delay of a signal or the like easily occurs in a portion in contact with a terminal in contact with the first gate electrode 50.

By further providing the second gate electrode 52, the delay of a signal can be suppressed. Here, as the second gate electrode 52, any known metal material such as a structure in which Ti and Al are stacked, Al, copper (Cu), or titanium nitride (TiN) can be used preferably.

In the semiconductor device 300 in FIG. 3B, a first insulating layer 30 is not provided between a source electrode 40 and the first gate electrode 50 or between a drain electrode 60 and the first gate electrode 50. A similar effect to the semiconductor device 200 can be obtained also in the semiconductor device 300.

Here, the first insulating layer 30 between the source electrode 40 and the first gate electrode 50 or between the drain electrode 60 and the first gate electrode 50 is removed by etching, for example. However, when a nitride semiconductor layer 14 is damaged by the etching, current collapse or the like may occur easily.

As described above, according to the semiconductor device of the present embodiment, a semiconductor device having a high threshold voltage can be provided.

Third Embodiment

A semiconductor device of the present embodiment includes a first electrode, a second electrode, a third electrode containing a polycrystalline nitride semiconductor containing a p-type impurity, a nitride semiconductor layer provided between the first electrode and the second electrode and between the second electrode and the third electrode, a first insulating layer provided between the third electrode and the nitride semiconductor layer, a first conductivity type first nitride semiconductor region provided in the nitride semiconductor layer, the first nitride semiconductor region having at least a first portion in contact with the first electrode, a second conductivity type second nitride semiconductor region provided in the nitride semiconductor layer, the second nitride semiconductor region having at least second a portion in contact with the first nitride semiconductor region and having at least a third portion in contact with the first insulating layer, and a first conductivity type third nitride semiconductor region provided in the nitride semiconductor layer, the second nitride semiconductor region provided between the first nitride semiconductor region and the third nitride semiconductor region, the third nitride semiconductor region having at least a fourth portion in contact with the first insulating layer.

The semiconductor device of the present embodiment is a vertical type double implantation metal oxide semiconductor field effect transistor (DI MOSFET). Here, matters overlapping with the first or second embodiment will be omitted.

In the present embodiment, a case where the first conductivity type is an n-type and the second conductivity type is a p-type will be exemplified. In the following description, $n^+$, n, $n^-$, $p^+$, p, and $p^-$ each indicate the relative degree of an impurity concentration in each conductivity type. That is, it is indicated that $n^+$ has a relatively higher n-type impurity concentration than n and that $n^-$ has a relatively lower n-type impurity concentration than n. It is indicated that $p^+$ has a relatively higher p-type impurity concentration than p and that $p^-$ has a relatively lower p-type impurity concentration than p. An $n^+$ type or an $n^-$ type may be referred to simply as an n type. A $p^+$ type or a $p^-$ type may be referred to simply as a p type.

In the description of the present embodiment, "be in contact" includes a case of being in direct contact and a case of being in indirect contact through an intermediate layer or the like.

Figure 4:
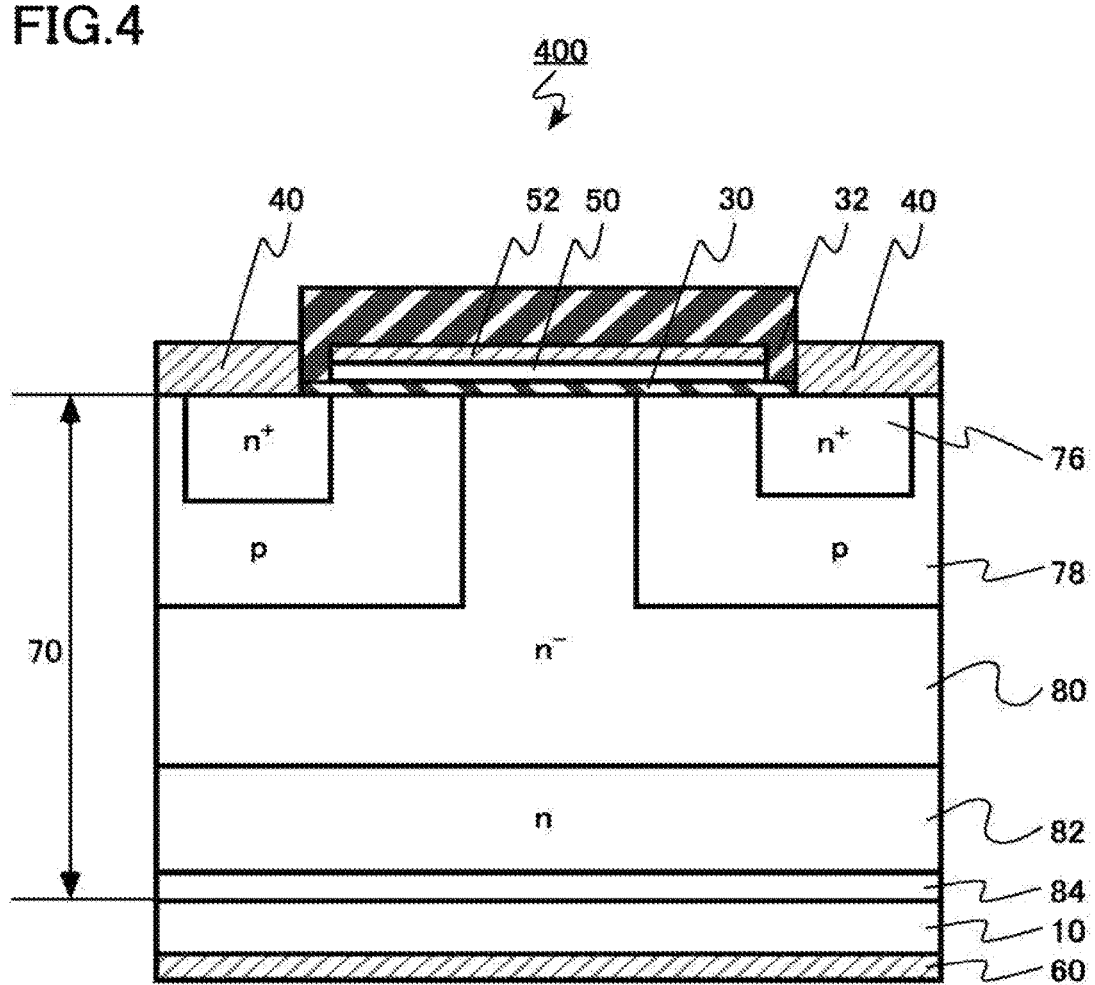
FIG. 4 is a schematic cross-sectional view of a semiconductor device of a third embodiment.

FIG. 4 is a schematic cross-sectional view of a semiconductor device 400 of the present embodiment.

The semiconductor device 400 includes a substrate 10, a first insulating layer (gate insulating layer) 30, a second insulating layer 32, a source electrode (first electrode) 40, a first gate electrode (third electrode) 50, a second gate electrode (fourth electrode) 52, a drain electrode (second electrode) 60, a nitride semiconductor layer 70, a first conductivity type first nitride semiconductor region 76, a second conductivity type second nitride semiconductor region 78, a first conductivity type third nitride semiconductor region 80, a first conductivity type fourth nitride semiconductor region 82, and a fifth nitride semiconductor region 84.

Two source electrodes 40 are provided. The first gate electrode 50 is provided between the two source electrodes 40.

The nitride semiconductor layer 70 is provided between the source electrode 40 and the drain electrode 60 and between the drain electrode 60 and the first gate electrode 50. The source electrode 40 is in contact with the nitride semiconductor layer 70.

The first insulating layer 30 is provided between the first gate electrode 50 and the nitride semiconductor layer 70. The first insulating layer 30 is a gate insulating layer.

The first gate electrode 50 is provided on the first insulating layer 30. The first gate electrode 50 contains a polycrystalline nitride semiconductor containing a p-type impurity.

The second gate electrode 52 is provided on the first gate electrode 50.

The second insulating layer 32 is provided between the source electrode 40 and the first gate electrode 50 on the first insulating layer 30, between the source electrode 40 and the second gate electrode 52 on the first insulating layer 30, and on the second gate electrode 52. The second insulating layer 32 electrically insulates the source electrode 40 from the first gate electrode 50 and the second gate electrode 52.

The $n^+$ type first nitride semiconductor region 76 is provided in the nitride semiconductor layer 70, and at least a portion of the first nitride semiconductor region 76 is in contact with the source electrode 40. The first nitride semiconductor region 76 is a source region. Here, the n-type impurity is Si or germanium (Ge), for example.

The p-type second nitride semiconductor region 78 is provided in the nitride semiconductor layer 70. At least a portion of the second nitride semiconductor region 78 is in contact with the first nitride semiconductor region 76. At least a portion of the second nitride semiconductor region 78 is in contact with the first insulating layer 30. The second nitride semiconductor region 78 is electrically connected to the source electrode 40. The second nitride semiconductor region 78 is a well region.

The $n^-$ type third nitride semiconductor region 80 is provided in the nitride semiconductor layer 70. The second nitride semiconductor region 78 is sandwiched between the third nitride semiconductor region 80 and the first nitride semiconductor region 76. The second nitride semiconductor region 78 is provided between the first nitride semiconductor region 76 and the third nitride semiconductor region 80. At least a portion of the third nitride semiconductor region 80 is in contact with the first insulating layer 30. The third nitride semiconductor region 80 is a drift region.

The substrate 10 is provided between the drain electrode 60 and the nitride semiconductor layer 70.

The n-type fourth nitride semiconductor region 82 is provided between the third nitride semiconductor region 80 and the substrate 10 in the nitride semiconductor layer 70. The fourth nitride semiconductor region 82 is a drain region.

The fifth nitride semiconductor region 84 is provided between the fourth nitride semiconductor region 82 and the substrate 10 in the nitride semiconductor layer 70. The fifth nitride semiconductor region 84 is a buffer layer.

Figure 5:
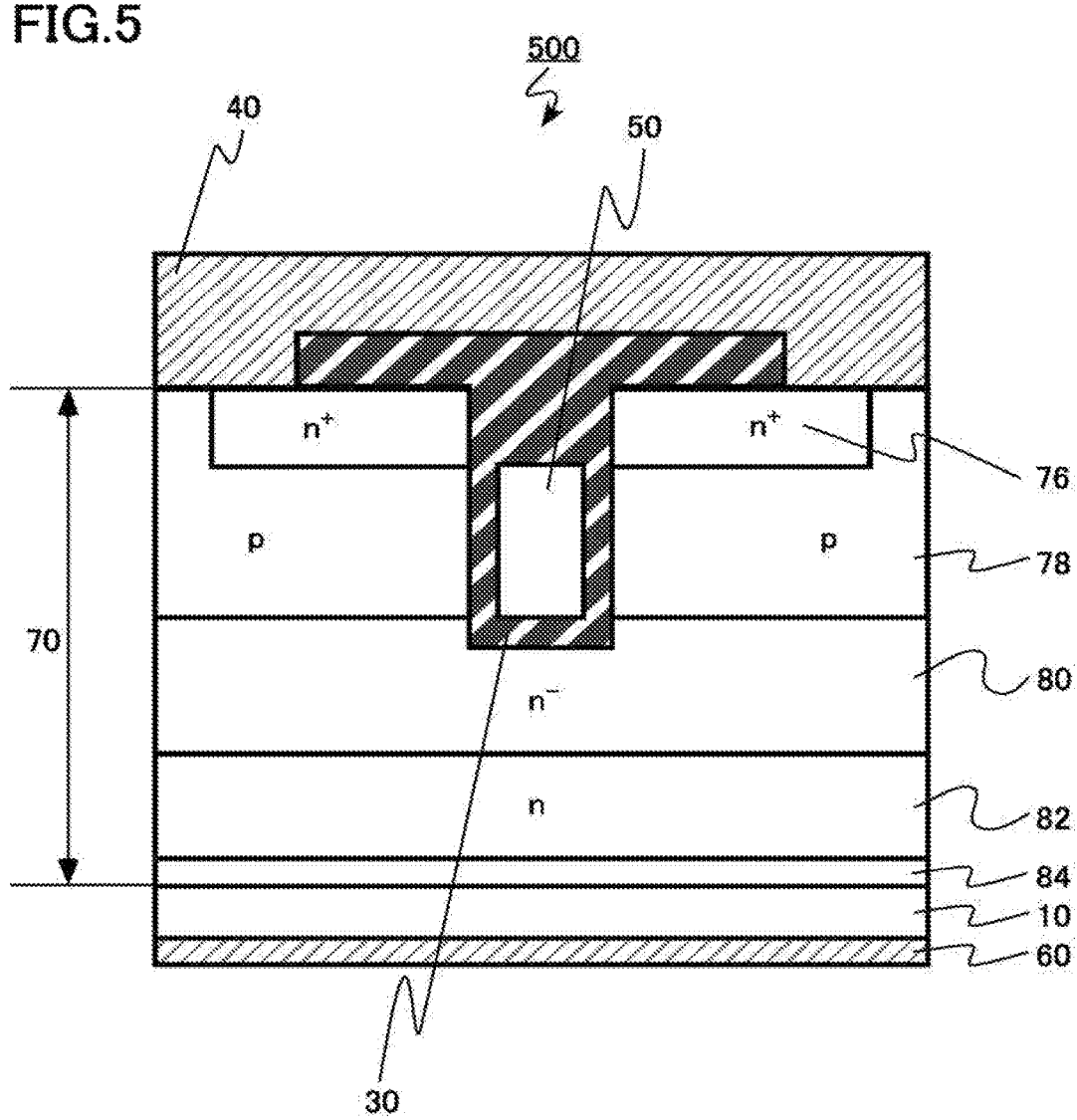
FIG. 5 is a schematic cross-sectional view of a semiconductor device of another aspect of the third embodiment.

FIG. 5 is a schematic cross-sectional view of a semiconductor device 500 of another aspect of the present embodiment.

A semiconductor device of the present embodiment includes a first electrode, a second electrode, a first conductivity type first nitride semiconductor region provided between the first electrode and the second electrode, a second conductivity type second nitride semiconductor region provided between the first nitride semiconductor region and the second electrode, a first conductivity type third nitride semiconductor region provided between the second nitride semiconductor region and the second electrode, a first conductivity type fourth nitride semiconductor region provided between the third nitride semiconductor region and the second electrode, a fifth nitride semiconductor region provided between the fourth nitride semiconductor region and the second electrode, a substrate provided between the fifth nitride semiconductor region and the second electrode, and a first gate electrode containing a polycrystalline nitride semiconductor containing a p-type impurity, provided in the first nitride semiconductor region, the second nitride semiconductor region, and the third nitride semiconductor region via the first insulating layer.

The semiconductor device 500 of the present embodiment is a trench type metal oxide semiconductor field effect transistor (MOSFET).

Figure 6:
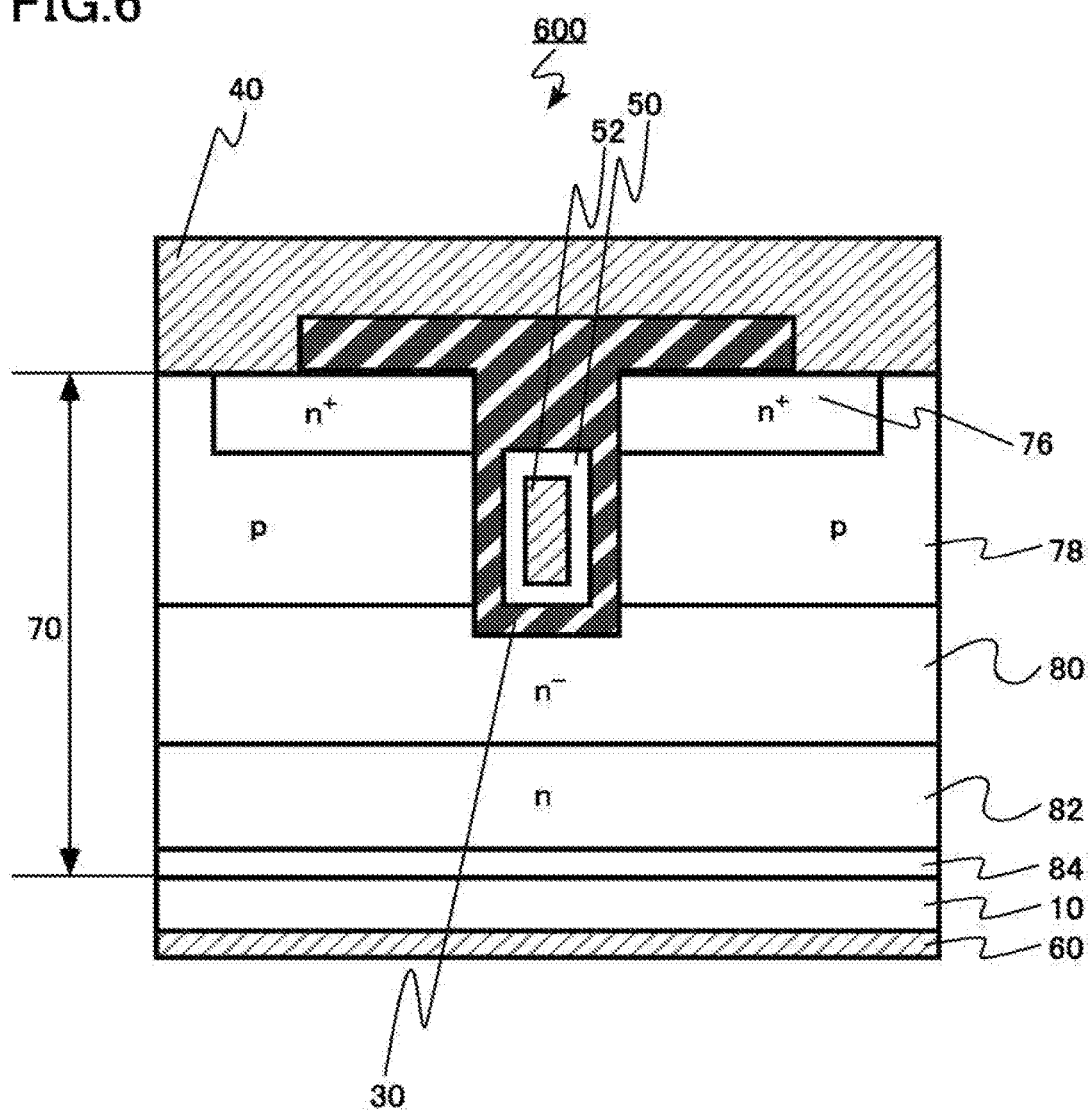
FIG. 6 is a schematic cross-sectional view of a semiconductor device of another aspect of the third embodiment.

FIG. 6 is a schematic cross-sectional view of a semiconductor device 600 of another aspect of the present embodiment. The semiconductor device 600 is different from the semiconductor device 500 in further including the metal-containing second gate electrode 52 provided in the first gate electrode 50.

Also according to the semiconductor device 600 of the present embodiment, a semiconductor device having a high threshold voltage can be provided.

Fourth Embodiment

A power supply circuit and a computer of the present embodiment includes the semiconductor device according to the first to third embodiments.

FIG. 7 is a schematic diagram of a computer of the present embodiment. The computer of the present embodiment is a server 700.

The server 700 includes a power supply circuit 704 in a housing 702. The server 700 is a computer for making a server software operate.

The power supply circuit 704 includes the semiconductor device 100 of the first embodiment. The semiconductor device 200, the semiconductor device 300, the semiconductor device 400, the semiconductor device 500, and the semiconductor device 600 of the second and third embodiments may be used in place of the semiconductor device 100.

The power supply circuit 704 includes the semiconductor device 100 having high reliability. In addition, the server 700 includes the power supply circuit 704, and therefore has high reliability.

The power supply circuit 704 can be applied to an inverter circuit, a drive apparatus, a railroad vehicle, an automobile or an elevator.

The present embodiment can realize a power supply circuit and a computer having high reliability.

According to the semiconductor device of at least one of the above-described embodiments, by including a nitride semiconductor layer, a first electrode provided on the nitride semiconductor layer, a second electrode provided on the nitride semiconductor layer, a third electrode provided on the nitride semiconductor layer between the first electrode and the second electrode and containing a polycrystalline nitride semiconductor with a p-type impurity, and a first insulating layer provided between the nitride semiconductor layer and the third electrode, a semiconductor device having a high threshold voltage can be provided.

While certain embodiments have been described, these embodiments have been presented by way of example only, and are not intended to limit the scope of the inventions. Indeed, the semiconductor device, the power supply circuit and the computer described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising: a nitride semiconductor layer; a first electrode provided on the nitride semiconductor layer; a second electrode provided on the nitride semiconductor layer; a third electrode provided above the nitride semiconductor layer, the third electrode provided between the first electrode and the second electrode, the third electrode containing a polycrystalline nitride semiconductor containing a p-type impurity; and a first insulating layer provided between the nitride semiconductor layer and the third electrode, the nitride semiconductor layer being separated from the third electrode by the first insulating layer, and the third electrode not being in direct contact with the nitride semiconductor layer, wherein the nitride semiconductor layer includes a first semiconductor layer and a second semiconductor layer provided on the first semiconductor layer and having a larger bandgap than the first semiconductor layer.

2. The semiconductor device according to claim 1, wherein the p-type impurity has a concentration of $1 \times 10^{19}$ atoms/cm$^3$ or more.

3. The semiconductor device according to claim 1, wherein the p-type impurity is magnesium, beryllium, carbon, or zinc.

4. The semiconductor device according to claim 1, wherein the polycrystalline nitride semiconductor has a composition represented by the following formula (Chemical formula 1)

$$In_xAl_yGa_{1-x-y}N \quad (1)$$

wherein each of x and y satisfies $0 \leq x+y < 0.5$, $0 \leq x$, and $0 \leq y$.

5. The semiconductor device according to claim 1, wherein the first insulating layer contains a nitride insulator.

6. The semiconductor device according to claim 5, wherein the nitride insulator is aluminum nitride or silicon nitride.

7. The semiconductor device according to claim 5, wherein a portion of the first insulating layer in contact with the nitride semiconductor layer contains a single crystal nitride insulator.

8. The semiconductor device according to claim 7, wherein the single crystal nitride insulator has a thickness of 10 nm or less.

9. The semiconductor device according to claim 1, wherein a distance between the first insulating layer and the first semiconductor layer is constant between the first electrode and the second electrode.

10. The semiconductor device according to claim 9, wherein the third electrode has a thickness of 100 nm or less.

11. The semiconductor device according to claim 1, further comprising a fourth electrode containing a metal and provided on the third electrode.

12. The semiconductor device according to claim 1, further comprising a substrate, wherein the nitride semiconductor layer is provided between the substrate and the first insulating layer.

13. The semiconductor device according to claim 12, further comprising a third semiconductor layer provided between the nitride semiconductor layer and the substrate.

14. A power supply circuit comprising the semiconductor device according to claim 1.

15. A computer comprising the semiconductor device according to claim 1.

* * * * *